United States Patent
Toujo

(10) Patent No.: US 10,382,000 B2
(45) Date of Patent: *Aug. 13, 2019

(54) CIRCUIT BOARD, FILTER CIRCUIT USING THE SAME, AND CAPACITANCE ELEMENT

(71) Applicant: Murata Manufacturing Co., Ltd., Nagaokakyo-shi, Kyoto-fu (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 103 days.

This patent is subject to a terminal disclaimer.

(21) Appl. No.: 15/726,502

(22) Filed: Oct. 6, 2017

(65) Prior Publication Data

US 2018/0040427 A1    Feb. 8, 2018

Related U.S. Application Data

(63) Continuation of application No. PCT/JP2016/057987, filed on Mar. 14, 2016.

(30) Foreign Application Priority Data

Jul. 28, 2015  (JP) .................................. 2015-148594

(51) Int. Cl.
*H03H 7/01*   (2006.01)
*H01G 4/35*   (2006.01)
(Continued)

(52) U.S. Cl.
CPC ................ *H03H 7/01* (2013.01); *H01G 2/06* (2013.01); *H01G 4/005* (2013.01); *H01G 4/228* (2013.01);
(Continued)

(58) Field of Classification Search
CPC ............................................................ H01G 4/35; H01G 4/232; H01G 2/06; H01G 4/228; H01G 4/005; H01G 4/40;
(Continued)

(56) References Cited

U.S. PATENT DOCUMENTS 8,988,167 B2 *  3/2015  Yazaki ................ H01F 17/0013
                                                            333/176
9,106,313 B2    8/2015  Ueki et al.
(Continued)

FOREIGN PATENT DOCUMENTS

JP    56-128007 A    10/1981
JP    2000-315930 A  11/2000
(Continued)

OTHER PUBLICATIONS

Kostov et al., "Combing Diagonal connection and cancellation turn in electromagnetic interference filtering", Apr. 2014, IET Power Electronics, vol. 7, Issue 3, pp. 559-566 (Year: 2014).*
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A circuit board mounted with a capacitor includes an electrode to connect one terminal of a capacitor, a first inductor including a wiring pattern that extends from a first end connected with the electrode to a second end across a region mounted with the capacitor, and a second inductor including a wiring pattern that extends from the first end connected with the electrode to a second end across the region mounted with the capacitor from the opposite side from the first inductor. In a plan view, the wiring pattern of the first inductor and the wiring pattern of the second inductor intersect with each other, and an angle defined by the wiring
(Continued)

pattern of the first inductor and the wiring pattern of the second inductor is an angle other than a right angle.

16 Claims, 10 Drawing Sheets

(51) Int. Cl.
*H01G 4/40* (2006.01)
*H03H 7/075* (2006.01)
*H01G 4/005* (2006.01)
*H01G 4/228* (2006.01)
*H03H 7/09* (2006.01)
*H03H 1/00* (2006.01)
*H01G 2/06* (2006.01)
*H01G 4/232* (2006.01)
*H01G 4/38* (2006.01)

(52) U.S. Cl.
CPC ............... *H01G 4/232* (2013.01); *H01G 4/35* (2013.01); *H01G 4/40* (2013.01); *H03H 1/0007* (2013.01); *H03H 7/0115* (2013.01); *H03H 7/075* (2013.01); *H03H 7/09* (2013.01); *H01G 4/385* (2013.01); *H03H 2001/0085* (2013.01)

(58) Field of Classification Search
CPC .... H01G 4/385; H03H 7/0115; H03H 1/0007; H03H 7/09; H03H 7/075; H03H 7/01; H03H 2001/0085
USPC .................................................. 333/175, 185
See application file for complete search history.

(56) References Cited

U.S. PATENT DOCUMENTS

2011/0309994 A1   12/2011   Kato et al.
2014/0065980 A1    3/2014   Ueki et al.

FOREIGN PATENT DOCUMENTS

JP   2012-085251 A    4/2012
WO   2012/153691 A1   11/2012

OTHER PUBLICATIONS

Official Communication issued in International Patent Application No. PCT/JP2016/057987, dated May 31, 2016.

* cited by examiner ved herein# CIRCUIT BOARD, FILTER CIRCUIT USING THE SAME, AND CAPACITANCE ELEMENT

CROSS REFERENCE TO RELATED APPLICATIONS

This application claims the benefit of priority to Japanese Patent Application No. 2015-148594 filed on Jul. 28, 2015 and is a Continuation Application of PCT Application No. PCT/JP2016/057987 filed on Mar. 14, 2016. The entire contents of each application are hereby incorporated herein by reference.

BACKGROUND OF THE INVENTION

1. Field of the Invention

The present invention relates to a circuit board, a filter circuit including the circuit board, and a capacitance element, and particularly relates to a circuit board mounted with a capacitance element, a filter circuit including the circuit board, and a capacitance element provided with a circuit.

2. Description of the Related Art

As a measure against noise of an electronic device, a filter circuit is often used. Examples of this filter circuit include an EMI (Electro-Magnetic Interference) removal filter. The filter circuit is a circuit that allows passage of a necessary component and removes an unnecessary component in a current flowing in a conductor, and a capacitor being a capacitance element may be used in a configuration of the circuit. It is known that in the filter circuit using the capacitor, a noise reduction effect deteriorates due to equivalent series inductance (ESL) that is parasitic inductance of the capacitor.

Meanwhile, there is known a configuration of an antenna device in which an effective inductance component of an antenna element is reduced by using a pseudo negative inductance component of an impedance converter circuit (e.g., Japanese Patent Application Laid-Open No. 2012-85251).

However, when the parasitic inductance of the capacitor is to be canceled by using the impedance converter circuit shown in Japanese Patent Application Laid-Open No. 2012-85251, there have been cases where the parasitic inductance of the capacitor cannot be sufficiently canceled by simply using the impedance converter circuit for the filter circuit. Especially in the case of manufacturing a circuit board to cancel the parasitic inductance of the capacitor, it has been necessary to consider manufacturing variations in the circuit board.

SUMMARY OF THE INVENTION

Accordingly, preferred embodiments of the present invention provide circuit boards that take into consideration effects of manufacturing variations on canceling parasitic inductance of a capacitance element, filter circuits including such circuit boards, and capacitance elements including such circuits.

A circuit board according to one aspect of a preferred embodiment of the present invention is a circuit board mounted with a capacitance element, the circuit board including an electrode to connect one terminal of the capacitance element; a first inductance element including a first wire that extends from one end connected with the electrode to the other end across a region mounted with the capacitance element; and a second inductance element including a second wire that extends from one end connected with the electrode to the other end across the region mounted with the capacitance element from the opposite side from the first wire. In the circuit board, in a plan view, the first wire of the first inductance element and the second wire of the second inductance element intersect with each other, and any angle defined by the first wire and the second wire is an angle other than a right angle.

A filter circuit according to one aspect of a preferred embodiment of the present invention includes the above circuit board, and a capacitor mounted in the circuit board as the capacitance element.

A capacitance element according to one aspect of a preferred embodiment of the present invention is a capacitance element including a circuit on the surface or inside. In the capacitance element, the circuit includes a first inductance element including a first wire that extends from one end connected with one terminal of the capacitance element to the other end across the capacitance element, and a second inductance element including a second wire that extends from one end connected with one terminal of the capacitance element to the other end across the capacitance element from the opposite side from the first wire, and in a plan view, the first wire of the first inductance element and the second wire of the second inductance element intersect with each other, and any angle defined by the first wire and the second wire is an angle other than a right angle.

A capacitance element according to one aspect of a preferred embodiment of the present invention is a capacitance element including a ceramic body including a plurality of laminated ceramic layers and including a pair of main surfaces that face each other and side surfaces connecting the main surfaces; a plurality of internal electrodes disposed inside the ceramic body; and a plurality of external electrodes disposed on the side surfaces of the ceramic body and electrically connected respectively with the plurality of internal electrodes. In the ceramic body, a first functional portion and a second functional portion are disposed along a height direction connecting the pair of mutually facing main surfaces, the first functional portion includes a first internal electrode including a linear shape and extending from a first side surface of the ceramic body to a second side surface of the ceramic body which does not face the first side surface, and a second internal electrode including a linear shape and extending from the first side surface to a third side surface of the ceramic body which faces the second side surface, the first internal electrode and the second internal electrode are disposed via the ceramic layers and respectively constitute inductance elements, any angle defined by the first internal electrode and the second internal electrode, which intersect with each other, is an angle other than a right angle in a plan view, the second functional portion includes a third internal electrode including a surface shape and extending from the first side surface, and a fourth internal electrode including a surface shape and extending from a fourth side surface of the ceramic body which faces the first side surface, and a plurality of combinations of the third internal electrode and the fourth internal electrode which face the height direction are disposed via the ceramic layers.

According to preferred embodiments of the present invention, in the plan view, the first wire of the first inductance element and the second wire of the second inductance element intersect with each other, and any angle defined by the first wire and the second wire is an angle other than a right angle. Thus, even when deviations in lamination occur in the circuit board due to manufacturing variations, such deviations have little or no influence on a negative inductance component that cancels parasitic inductance of the capacitance elements. Further, mounting the capacitance element in the above-described circuit board enables creation filter circuits in which manufacturing variations have little or no influence on noise reduction effects in a high frequency band. Moreover, in the capacitance element including the circuit on the surface or inside to cancel the parasitic inductance, in the plan view, the first wire of the first inductance element and the second wire of the second inductance element intersect with each other, and any angle defined by the first wire and the second wire is an angle other than a right angle. This significantly reduces or prevents an influence on the negative inductance component exerted due to manufacturing variations.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, description will be given of circuit boards, filter circuits including such circuit boards, and capacitor elements, according to preferred embodiments of the present invention.

First Preferred Embodiment

Figure 1:
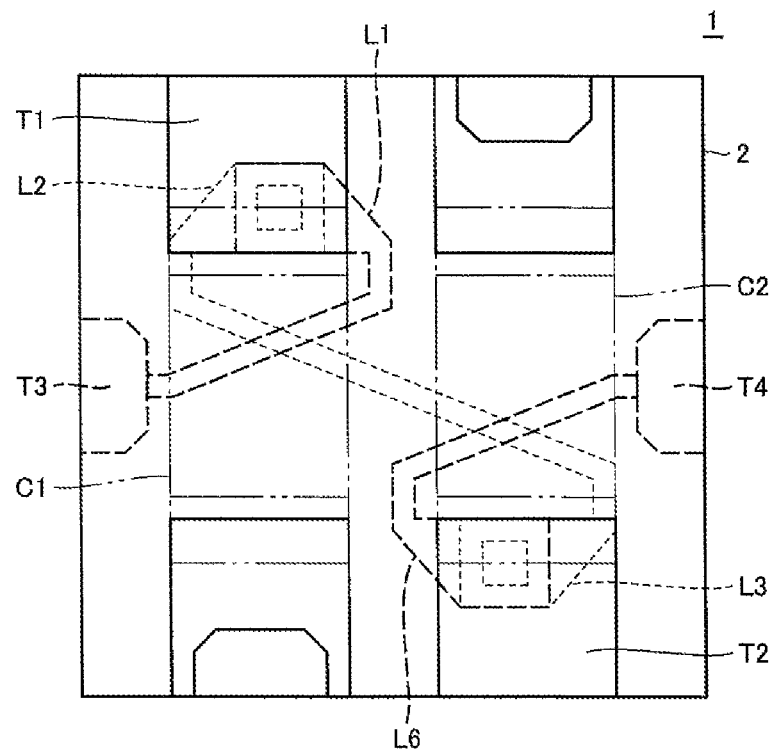
FIG. 1 is a plan view of a filter circuit according to a first preferred embodiment of the present invention.
Figure 2:
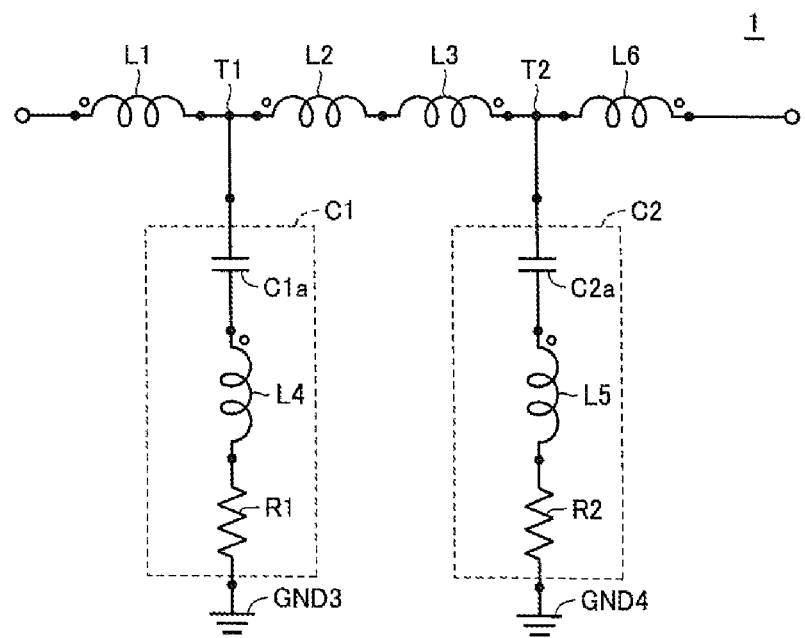
FIG. 2 is a circuit diagram of the filter circuit according to the first preferred embodiment of the present invention.

Hereinafter, a description will be given of a circuit board and a filter circuit including this circuit board according to the first preferred embodiment of the present invention with reference to the drawings. FIG. 1 is a plan view of the filter circuit according to the first preferred embodiment of the present invention. FIG. 2 is a circuit diagram of a filter circuit 1 according to the first preferred embodiment of the present invention.

A filter circuit 1 is, for example, an EMI removal filter and a fifth T-type LC filter circuit. Although a description will be given using the fifth T-type LC filter circuit as an example configuration of the filter circuit in the first preferred embodiment, the filter circuit is similarly applicable to a third T-type LC filter circuit or a T-type LC filter circuit of a higher order. First, as shown in FIG. 2, the filter circuit 1 is provided with a capacitor C1, a capacitor C2, an electrode T1, an inductor L1, an inductor L2, an inductor L3, an electrode T2, and an inductor L6.

The capacitor C1 includes one terminal connected to the electrode T1, and the other terminal connected to a ground electrode GND3. The capacitor C1 includes an inductor L4 as parasitic inductance (equivalent series inductance (ESL)) and a resistor R1 as parasitic resistance (equivalent series resistance (ESR)), and is equivalent to a circuit configuration in which the inductor L4 and the resistor R1 are connected in series with a capacitor C1a. The electrode T1 is connected with the inductor L1 and the inductor L2, other than the capacitor C1. The inductor L1 and the inductor L2 are tightly coupled, to cause generation of pseudo negative inductance component. This negative inductance component cancels the parasitic inductance (the inductor L4) of the capacitor C1, to make the inductance component of the capacitor C1 apparently small. When a circuit including the capacitor C1, the inductor L1, and the inductor L2 is considered as a third T-type LC filter circuit, the filter circuit cancels the parasitic inductance (the inductor L4) by using the negative inductance components of the inductor L1 and the inductor L2, to enable improvement of the noise reduction effect in the high frequency band.

The capacitor C2 includes one terminal connected with the electrode T2, and the other terminal connected with a ground electrode GND4. The capacitor C2 includes an inductor L5 as parasitic inductance and a resistor R2 as parasitic resistance, and is equivalent to a circuit configuration in which the inductor L5 and the resistor R2 are connected in series with a capacitor C2a. The electrode T2 is connected with the inductor L3 and the inductor L6, other than the capacitor C2. The inductor L3 and the inductor L6 are tightly coupled, to cause generation of pseudo negative inductance component. This negative inductance component cancels the parasitic inductance (the inductor L5) of the capacitor C2, to make the inductance component of the capacitor C2 apparently small. When a circuit including the capacitor C2, the inductor L3, and the inductor L6 is considered as a third T-type LC filter circuit, the filter circuit cancels the parasitic inductance (the inductor L5) by using the negative inductance components of the inductor L3 and the inductor L6, to enable improvement of the noise reduction effect in the high frequency band.

As shown in FIG. 1, in the filter circuit 1, the capacitor C1 and the capacitor C2 are mounted in parallel in a circuit board 2. The electrode T1 and the electrode T2 are provided on a plane of the circuit board 2 where the capacitor C1 and the capacitor C2 are mounted.

The circuit board 2 is a multilayered board which is a glass epoxy board, and includes a plurality of layers. The electrode T1 and the electrode T2 are provided on a first layer which is the plane where the capacitor C1 and the capacitor C2 are mounted. Other than those, the first layer is provided with an electrode different from the electrode T1 and the electrode T2 mounted with the capacitor C1 and the capacitor C2. A second layer located below the first layer is provided with coil-shaped wiring patterns of the inductor L1 and the inductor L6, and provided with an electrode T3 and an electrode T4 which are connected with respective one terminals of the inductor L1 and the inductor L6. A third layer being a further lower layer is provided with coil-shaped wiring patterns of the inductor L2 and the inductor L3.

As shown in FIG. 1, the coil-shaped wiring pattern of the inductor L1 includes a linear-portion wiring pattern that is connected with the electrode T1 and extends along a long-side direction of the capacitor C1, and an oblique-portion wiring pattern that cuts across the capacitor C1 and reaches the electrode T3. As shown in FIG. 1, the coil-shaped wiring pattern of the inductor L2 includes a linear-portion wiring pattern that is connected with the electrode T1 and extends along the long-side direction of the capacitor C1, and an oblique-portion wiring pattern that cuts across the capacitor C1 from the opposite side from the wiring pattern of the inductor L1 and reaches the direction of the capacitor C2.

The coil-shaped wiring pattern of the inductor L1 and the coil-shaped wiring pattern of the inductor L2 have the same shape and are line-symmetric with respect to the electrode T1. Further, in the plan view, the oblique-portion wiring pattern of the inductor L1 and the oblique-portion wiring pattern of the inductor L2 intersect with each other in a position where the capacitor C1 is mounted, and any angle defined by the oblique-portion wiring pattern of the inductor L1 and the oblique-portion wiring pattern of the inductor L2 is an angle other than a right angle. That is, the oblique-portion wiring pattern of the inductor L1 and the oblique-portion wiring pattern of the inductor L2 do not orthogonally intersect with each other. The plan view here is a field of view from a normal direction of the plane of the circuit board 2 where the capacitors C1, C2 are mounted.

Similarly, as shown in FIG. 1, the coil-shaped wiring pattern of the inductor L6 includes a linear-portion wiring pattern that is connected with the electrode T2 and extends along a long-side direction of the capacitor C2, and an oblique-portion wiring pattern that cuts across the capacitor C2 and reaches the electrode T4. As shown in FIG. 1, the coil-shaped wiring pattern of the inductor L3 includes a linear-portion wiring pattern that is connected with the electrode T2 and extends along the long-side direction of the capacitor C2, and an oblique-portion wiring pattern that cuts across the capacitor C2 from the opposite side from the wiring pattern of the inductor L6 and reaches the direction of the capacitor C1. The coil-shaped wiring pattern of the inductor L6 and the coil-shaped wiring pattern of the inductor L3 have the same shape and are line-symmetric with respect to the electrode T2. Further, in the plan view, the oblique-portion wiring pattern of the inductor L6 and the oblique-portion wiring pattern of the inductor L3 intersect with each other in a position where the capacitor C2 is mounted, and any angle defined by the oblique-portion wiring pattern of the inductor L6 and the oblique-portion wiring pattern of the inductor L3 is an angle other than a right angle. That is, the oblique-portion wiring pattern of the inductor L6 and the oblique-portion wiring pattern of the inductor L3 do not orthogonally intersect with each other.

As shown in FIG. 1, the coil-shaped wiring patterns of the inductor L2 and the inductor L3 are provided continuously and are thus considered as one inductance element. That is, the left half of one inductance element in the figure functions as the inductor L2, and the right half of one inductance element in the figure functions as the inductor L3. This reduces manufacturing costs of the inductor L2 and the inductor L3. Naturally, the inductor L2 and the inductor L3 may be provided separately.

The wiring pattern of the inductor L1 has a coil shape, with its winding direction counterclockwise from the one electrode T3 to the electrode T1, and the wiring pattern of the inductor L2 has a coil shape, with its winding direction counterclockwise from the electrode T1 to the inductor L3 side. Thus, the winding directions of the coils of the inductor L1 and the inductor L2 are the same counterclockwise directions. Meanwhile, the wiring pattern of the inductor L6 has a coil shape, with its winding direction clockwise from the electrode T2 to the other electrode T4, and the wiring pattern of the inductor L3 has a coil shape, with its winding direction clockwise from the inductor L2 side to the electrode T2. Thus, the winding directions of the coils of the inductor L3 and the inductor L6 are the same clockwise directions. The winding directions of the inductor L1 and the inductor L2 and the winding directions of the inductor L3 and the inductor L6 are different from each other.

The inductor L1 and the inductor L2 are electrically connected with each other by a common via provided in the electrode T1. Similarly, the inductor L3 and the inductor L6 are electrically connected with each other by a common via provided in the electrode T2.

Figure 3A:
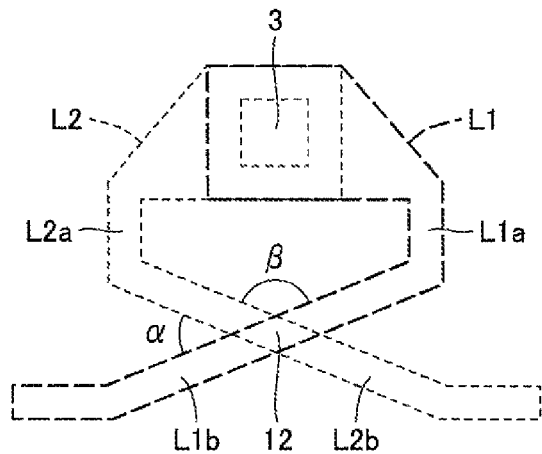
FIG. 3A is a plan view showing wiring patterns of inductors according to the first preferred embodiment of the present invention.
Figure 3B:
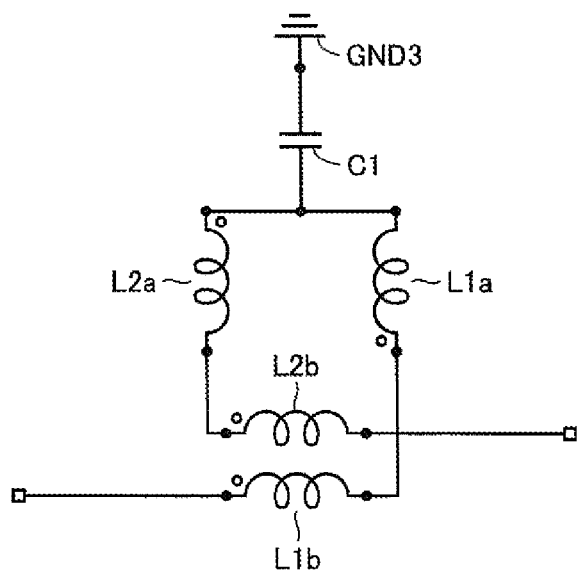
FIG. 3B is a circuit diagram showing an equivalent circuit according to the same.

Next, the coil-shaped wiring patterns of the inductor L1 and the inductor L2 will be described in detail. Note that the coil-shaped wiring patterns of the inductor L6 and the inductor L3 are the same as the coil-shaped wiring patterns of L1 and the inductor L2, and hence a detailed description thereof is omitted. FIG. 3A is a plan view showing wiring patterns of the inductors according to the first preferred embodiment of the present invention, and FIG. 3B is a circuit diagram showing an equivalent circuit according to the same. The plan view shown in FIG. 3A illustrates the coil-shaped wiring patterns of the inductor L1 and the inductor L2. The wiring pattern of the inductor L1 and the wiring pattern of the inductor L2 are connected to the electrode T1 by using a common via 3. The wiring pattern of the inductor L1 includes a linear-portion wiring pattern (corresponding to an inductor L1a) and an oblique-portion wiring pattern (corresponding to an inductor L1b). The wiring pattern of the inductor L2 includes a linear-portion wiring pattern (corresponding to an inductor L2a) and an oblique-portion wiring pattern (corresponding to an inductor L2b).

In the plan view, the inductor L1b and the inductor L2b intersect with each other at an intersection portion 12. Angles defined by the inductor L1b and the inductor L2b in the intersection portion 12 include an angle α defined clockwise from the inductor L1b to the inductor L2b, and an angle β defined clockwise from the inductor L2b to the inductor L1b. Neither the angle α nor the angle β is a right angle, and the angle β is larger than the angle α. The angle α is assumed to be about 22°, for example.

The circuit diagram shown in FIG. 2 illustrates each of the inductor L1 and the inductor L2 simply as one coil. However, as shown in FIG. 3A, the coil-shaped wiring patterns of the inductor L1 and the inductor L2 can be represented as an equivalent circuit as shown in FIG. 3B. The inductor L1 is divided into the inductor L1a corresponding to the linear-portion wiring pattern and the inductor L1b corresponding to the oblique-portion wiring pattern. Similarly, the inductor L2 is divided into the inductor L2a corresponding to the linear-portion wiring pattern and the inductor L2b corresponding to the oblique-portion wiring pattern. The inductor L1b and the inductor L2b include the intersection portion 12 and are thus disposed in positions adjacent to each other in the equivalent circuit. The smaller the angle α shown in FIG. 3A, the larger a coupling coefficient of the inductor L1b and the inductor L2b. Note that the coupling coefficient becomes largest when the inductor L1b and the inductor L2b are in a parallel state, rather than the inductor L1b and the inductor L2b intersect with each other.

However, if deviations in lamination occurs between the second layer provided with the inductor L1 and the third layer provided with the inductor L2 due to manufacturing variation, when the inductor L1b and the inductor L2b are in the parallel state, the distance between the inductor L1b and the inductor L2b may change to cause a great change in the coupling coefficient. That is, when the inductor L1b and the inductor L2b are disposed in the parallel state, manufacturing variation has a large influence on the coupling coefficient.

As described above, the filter circuit cancels the parasitic inductance (the inductor L4) by using the negative inductance components of the inductor L1 and the inductor L2, to enable improvement of the noise reduction effect in the high frequency band. Completely canceling this parasitic inductance requires generation of the negative inductance component including the same size as that of the parasitic inductance. While there is only one condition to generate the negative inductance component including the same size as that of the parasitic inductance, in a certain range centered at the condition, the parasitic inductance of each of the capacitors C1, C2 is able to be canceled to such an extent as to improve the noise reduction effect in the high frequency band. For example, when the value of the parasitic inductance is 1 nH, there is only one condition to make the values of the negative inductance components of the inductor L1 and the inductor L2 be −1 nH so as to completely cancel the parasitic inductance. However, when the parasitic inductance of each of the capacitors C1, C2 is to be canceled to such an extent as to improve the noise reduction effect in the high frequency band, the values of the negative inductance components of the inductor L1 and the inductor L2 may be in a range from about −1.2 nH to about −0.8 nH, for example. It is thus possible to provide a filter circuit that improves the noise reduction effect in the high frequency band even when a certain degree of manufacturing variation occurs.

However, when manufacturing variation increases and its influence on the coupling coefficient becomes large, there occurs variation between the negative inductance components of the inductor L1 and the inductor L2. When the variation occurs in the negative inductance component, the filter circuit may become far from satisfying the condition of completely canceling the parasitic inductance, and may thus not be able to improve the noise reduction effect in the high frequency band.

As a method for avoiding manufacturing variation due to deviations in lamination of the second layer provided with the inductor L1 and the third layer provided with the inductor L2, there is considered a method of forming the two inductors in the same one layer. However, when the two inductors are to be formed in the same one layer, the possible closest distance between the two inductors is limited in accordance with accuracy in formable wiring patterns, thus causing a problem of an increased size of the circuit board. For example, when the accuracy in wiring patterns formed in the circuit board needs to be about 100 μm, assuming that the two inductors are provided in the same layer, the distance between center lines of the two inductors needs to be not shorter than 200 μm, which leads to the increased size of the circuit board.

Accordingly, in the filter circuit 1 according to the present preferred embodiment, the two inductors are provided in different layers, but the inductor L1b and the inductor L2b are not brought into the parallel state, but the inductor L1b and the inductor L2b include the intersection portion 12 (the angle α is made other than 0 (zero)° or 180°). In a case where the inductor L1b and the inductor L2b orthogonally intersect with each other (the angle α=90°), the coupling coefficient of the inductor L1b and the inductor L2b is 0 (zero), and hence this case is removed from the configuration of the filter circuit 1 according to the present preferred embodiment. The coupling coefficient of the inductor L1b and the inductor L2b is small in the configuration where the inductor L1b and the inductor L2b include the intersection portion 12, as compared with the configuration where the inductor L1b and the inductor L2b are in the parallel state.

However, in the filter circuit 1 according to the present preferred embodiment, even when deviations in lamination occurs between the second layer provided with the inductor L1 and the third layer provided with the inductor L2 due to manufacturing variation, only the position of the intersection portion 12 is displaced, while a change in the distance between the inductor L1b and the inductor L2b is small and a change in the coupling coefficient is also small. Hence in the filter circuit 1 according to the present preferred embodiment, even when deviations in lamination occurs between the second layer and the third layer due to manufacturing variation, it is possible to improve the noise reduction effect in the high frequency band. Naturally, when angle deviations occurs between the second layer and the third layer, it has a large influence on the coupling coefficient. However, when the circuit board 2 is the multilayered board and is to be manufactured by the lamination technique, it is manufactured by being cut out of a collective board manufactured by laminating a plurality of large boards for mass production. Therefore, even when deviations occur at the end of the board, angle deviations caused by that deviations is considerably small and almost ignorable. For example, when the end surface of the board of approximately 200×200 mm is displaced by about 50 μm, angle deviations of only about 0.015° occurs. Note that the oblique-portion wiring pattern of the inductor L6 and the oblique-portion wiring pattern of the inductor L3 are also provided with an intersection portion (the angle α is made other than 0 (zero)° or 180°).

Figure 4A:
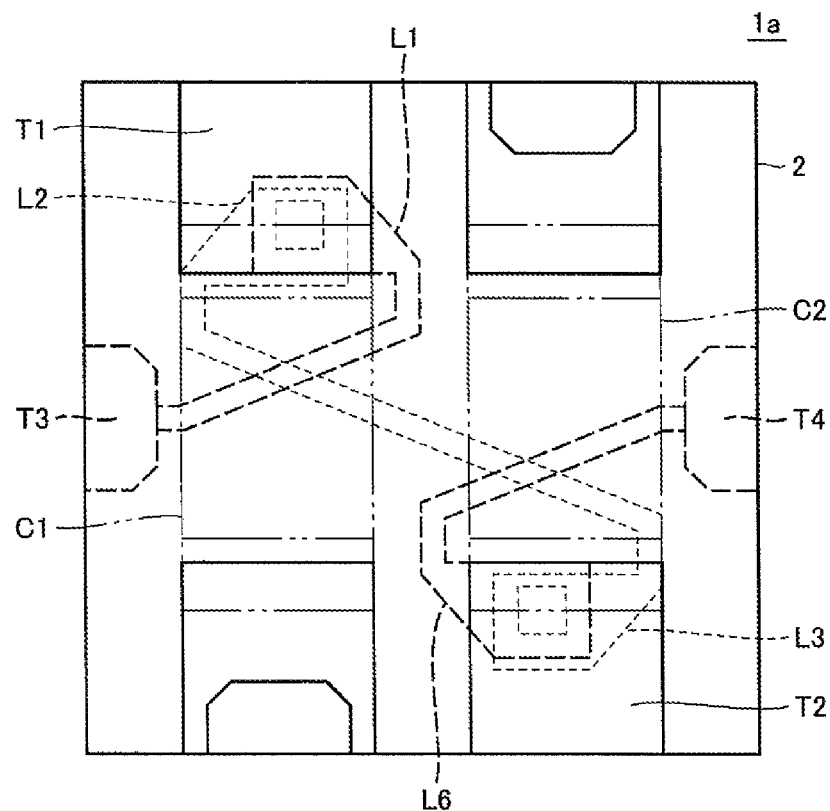
FIGS. 4A and 4B are plan views for describing deviations of the wiring patterns of the inductors in the filter circuit according to the first preferred embodiment of the present invention.
Figure 4B:
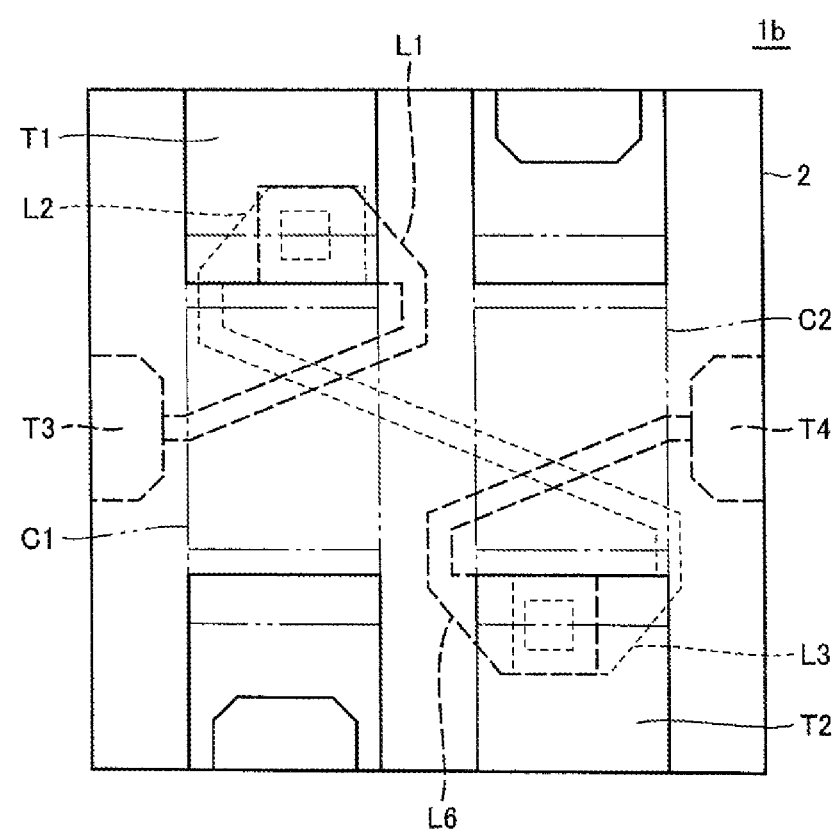

A specific description will be given of the influence on the noise reduction effect in the high frequency band in the case of occurrence of deviations in lamination between the second layer provided with the inductor L1 and the third layer provided with the inductor L2 caused by manufacturing variation. FIGS. 4A and 4B are plan views for describing deviations of the wiring patterns of the inductors in the filter circuit according to the first preferred embodiment of the present invention. Note that in the filter circuit 1 according to the present first preferred embodiment, it is assumed that the inductor L1b and the inductor L2b include the intersection portion 12, and the angle α is 22°. FIG. 4A shows a filter circuit 1a in the case of occurrence of deviations in lamination between the second layer provided with the inductor L1 and the third layer provided with the inductor L2 vertically in the figure (in a longer direction of the capacitor C1). Specifically, the third layer provided with the inductor L2 is displaced downward in the figure with respect to the second layer provided with the inductor L1 by about 50 μm, for example. Meanwhile, FIG. 4B shows a filter circuit 1b in the case of occurrence of deviations in lamination between the second layer provided with the inductor L1 and the third layer provided with the inductor L2 horizontally in the figure (in a shorter direction of the capacitor C1). Specifically, the third layer provided with the inductor L2 is displaced rightward in the figure with respect to the second layer provided with the inductor L1 by about 50 μm, for example.

Figure 5:
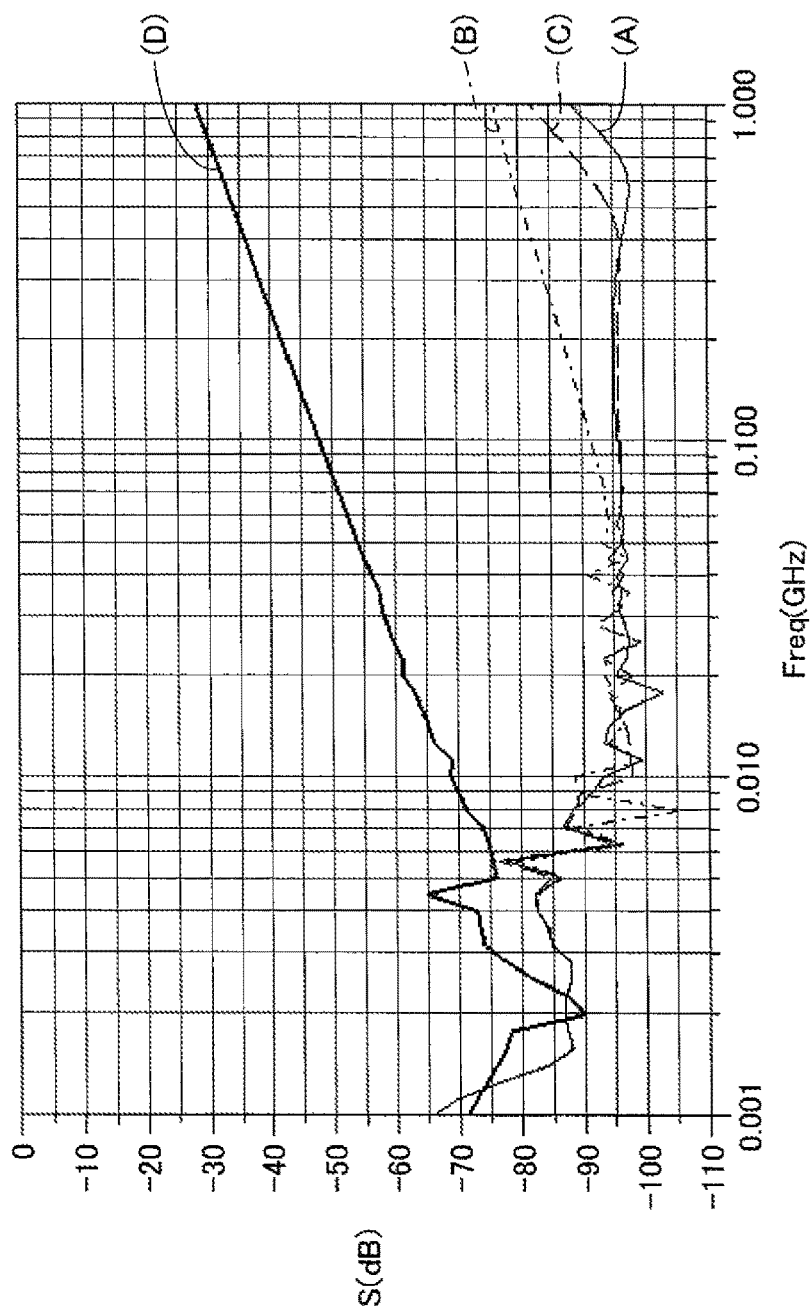
FIG. 5 is a graph showing transmission characteristics with respect to frequencies in the filter circuit according to the first preferred embodiment of the present invention.

FIG. 5 is a graph showing transmission characteristics with respect to frequencies in the filter circuit according to the first preferred embodiment of the present invention. The graph shown in FIG. 5 is a result obtained by performing circuit simulation on: the filter circuit 1 shown in FIG. 1 (with the circuit board (A)); the filter circuit 1a shown in FIG. 4A (with vertical deviations (B)); the filter circuit 1b shown in FIG. 4B (with horizontal deviations (C)); and a filter circuit not provided with the circuit board 2 (without the circuit board (D)), and showing transmission characteristics with respect to frequencies. In the graph of FIG. 5, a horizontal axis represents a frequency Freq (GHz), and a vertical axis represents a transmission characteristic S (dB).

As shown in FIG. 5, the transmission characteristic S of the filter circuit 1 provided with the circuit board 2 in frequencies Freq not lower than about 0.010 GHz decreases with respect to that of the filter circuit without the circuit board 2, thus enabling improvement of the noise reduction effect in the high frequency band. The filter circuit 1a is in the case where deviations in lamination has occurred vertically in the figure, but its transmission characteristic S in the frequencies Freq not lower than about 0.010 GHz sufficiently decreases with respect to that of the filter circuit without the circuit board 2, thus enabling improvement of the noise reduction effect in the high frequency band. Further, the transmission characteristic S of the filter circuit 1a at a frequency Freq of about 1.000 GHz changes just by about 15 dB with respect to that of the filter circuit 1, and experiences little or no influence due to manufacturing variations. The filter circuit 1b is in the case where the deviations in lamination has occurred horizontally in the figure, but its transmission characteristic S in the frequencies Freq not lower than about 0.010 GHz sufficiently decreases with respect to that of the filter circuit without the circuit board 2, thus enabling improvement of the noise reduction effect in the high frequency band. Further, the transmission characteristic S of the filter circuit 1b at the frequency Freq of about 1.000 GHz changes just by about 10 dB with respect to that of the filter circuit 1, and experiences little or no influence due to manufacturing variations.

Figure 6A:
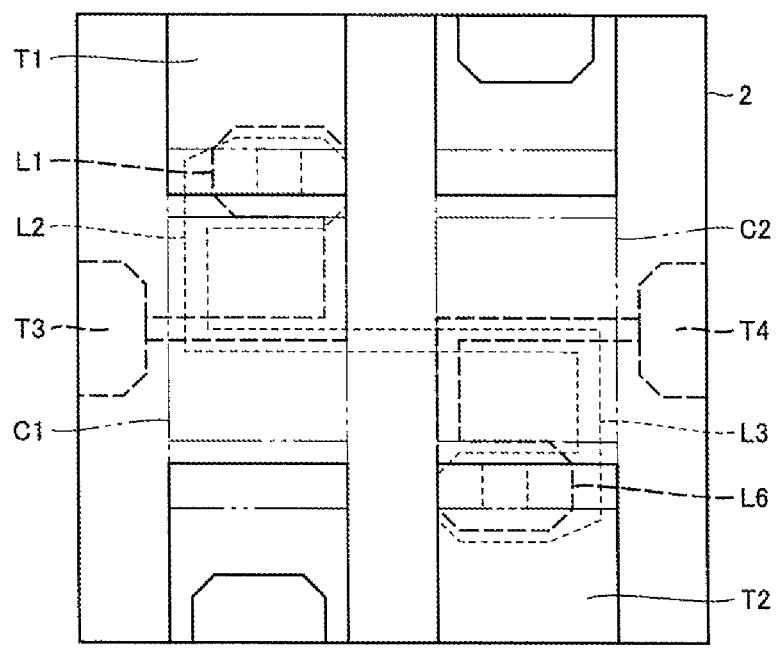
FIGS. 6A and 6B are plan views for describing deviations of wiring patterns of inductors in a filter circuit for comparison.
Figure 6B:
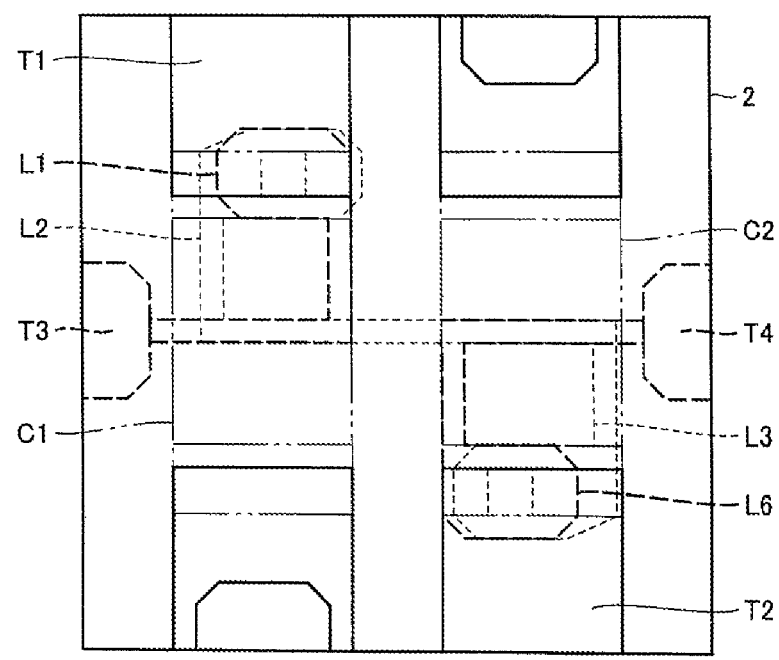

Meanwhile, a description will be given of the influence on the noise reduction effect in the high frequency band in the case of occurrence of deviations in lamination between the second layer provided with the inductor L1 and the third layer provided with the inductor L2 caused by manufacturing variation in a filter circuit (a filter circuit for comparison) with a configuration where the inductor L1b and the inductor L2b are in the parallel state. FIGS. 6A and 6B are plan views for describing deviations of wiring patterns of the inductors in the filter circuit for comparison. FIG. 6A shows a filter circuit 1A in the case of occurrence of deviations in lamination between the second layer provided with the inductor L1 and the third layer provided with the inductor L2 vertically in the figure (in the longer direction of the capacitor C1). Specifically, the third layer provided with the inductor L2 is displaced downward in the figure with respect to the second layer provided with the inductor L1 by about 50 μm, for example. Meanwhile, FIG. 6B shows a filter circuit 1B in the case of occurrence of deviations in lamination between the second layer provided with the inductor L1 and the third layer provided with the inductor L2 horizontally in the figure (in the shorter direction of the capacitor C1). Specifically, the third layer provided with the inductor L2 is displaced rightward in the figure with respect to the second layer provided with the inductor L1 by about 50 μm, for example.

Figure 7:
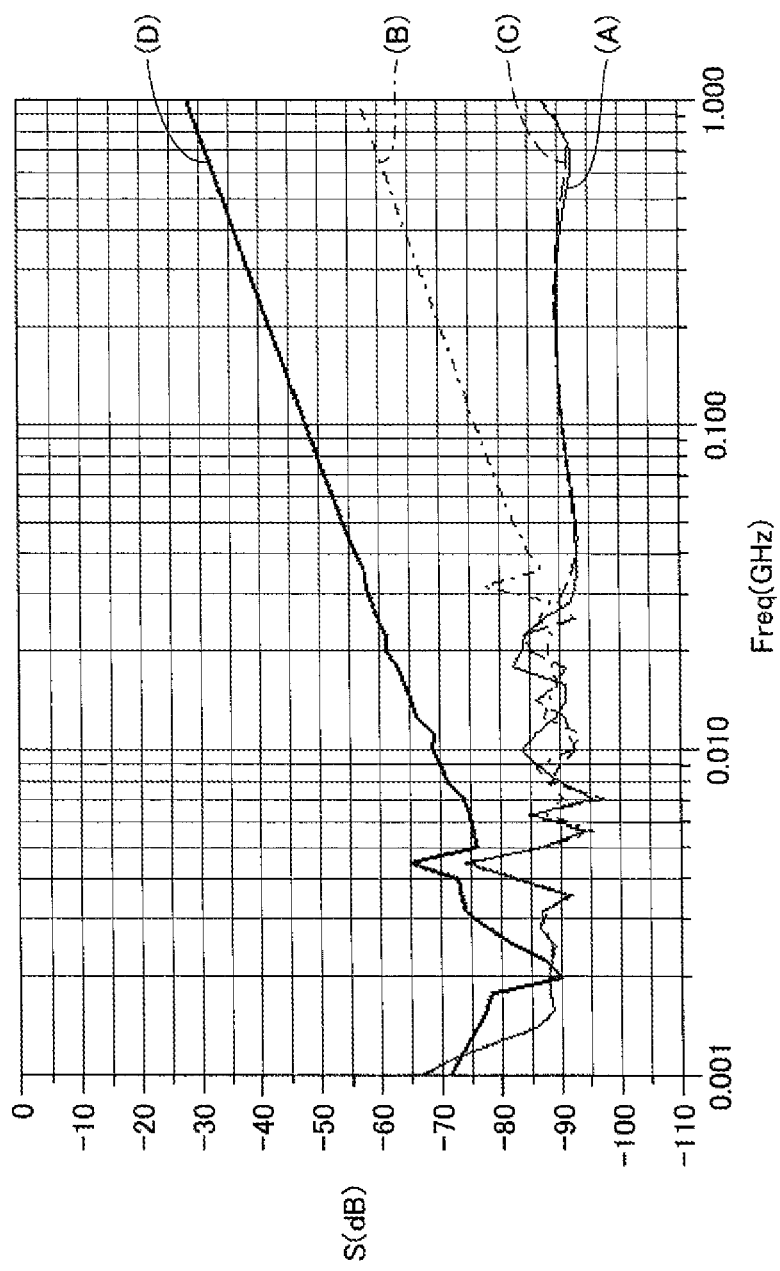
FIG. 7 is a graph showing transmission characteristics with respect to frequencies in the filter circuit for comparison.

FIG. 7 is a graph showing transmission characteristics with respect to frequencies in the filter circuit for comparison. The graph shown in FIG. 7 is a result obtained by performing circuit simulation on: the filter circuit for comparison (with the circuit board (A)); the filter circuit 1A shown in FIG. 6A (with vertical deviations (B)); the filter circuit 1B shown in FIG. 6B (with horizontal deviations (C)); and a filter circuit not provided with the circuit board 2 (without the circuit board (D)), and showing transmission characteristics with respect to frequencies. In the graph of FIG. 7, a horizontal axis represents a frequency Freq (GHz), and a vertical axis represents a transmission characteristic S (dB).

The filter circuit for comparison is a filter circuit provided with the circuit board 2 shown in FIGS. 6A and 6B, but in this filter circuit, the deviations in lamination as in FIGS. 6A and 6B have not occurred. Accordingly, as shown in FIG. 7, the transmission characteristic S of the filter circuit for comparison in frequencies Freq not lower than about 0.010 GHz decreases with respect to that of the filter circuit without the circuit board 2, thus enabling improvement of the noise reduction effect in the high frequency band. The filter circuit 1A is in the case where the deviations in lamination has occurred vertically in the figure, but its transmission characteristic S in the frequencies Freq not lower than about 0.010 GHz decreases with respect to that of the filter circuit without the circuit board 2. However, the transmission characteristic S of the filter circuit 1A at a frequency Freq of about 1.000 GHz changes by as large as about 30 dB with respect to that of the filter circuit where no deviations in lamination has occurred, and is greatly influenced by manufacturing variation. The filter circuit 1B is in the case where the deviations in lamination has occurred horizontally in the figure, but its transmission characteristic S in the frequencies Freq not lower than about 0.010 GHz sufficiently decreases with respect to that of the filter circuit without the circuit board 2, thus enabling improvement of the noise reduction effect in the high frequency band. Further, in the filter circuit 1B, since just the deviations in lamination have occurred horizontally in the figure, the distance between the inductors remains unchanged and the coupling coefficient is thus the same. That is, the transmission characteristic S of the filter circuit 1B is almost the same as the transmission characteristic S of the filter circuit where no deviations in lamination has occurred.

As above, in the filter circuit 1 according to the present preferred embodiment of the present invention, in the plan view, the oblique-portion wiring pattern (the inductor L1b) of the inductor L1 and the oblique-portion wiring pattern (the inductor L2b) of the inductor L2 intersect with each other, and any angle defined by the inductor L1b and the inductor L2b is an angle other than a right angle. Thus, even when deviations in lamination occurs in the circuit board due to manufacturing variation, it leads to a small change in the coupling coefficient and has a small influence on the noise reduction effect in the high frequency band.

As shown in FIG. 1, the circuit board 2 according to the present preferred embodiment of the present invention, the electrode (including the electrode T1) that can be mounted with the capacitor C1 is provided, and the inductors L1, L2 are provided for reducing an influence on the noise reduction effect exerted by the parasitic inductance of the capacitor C1. Further, since any angle defined by the inductor L1b and the inductor L2b is an angle other than a right angle in the circuit board 2, even when deviations in lamination occurs in the circuit board due to manufacturing variation, it has a small influence on the negative inductance component to cancel the parasitic inductance of each of the capacitors C1, C2. Accordingly, mounting the capacitor C1 in the circuit board 2 enables creation of a filter circuit in which manufacturing variation has a small influence on the noise reduction effect in the high frequency band.

Although it has been described that each of the capacitors C1, C2 is a multilayer ceramic capacitor, not only the multilayer ceramic capacitor mainly including BaTiO3 (barium titanate) is preferably used, but also a multilayer ceramic capacitor mainly including another substance may be used. Further, each of the capacitors C1, C2 is not restricted to the multilayer ceramic capacitor, but may be a capacitor of another kind, such as an aluminum electrolytic capacitor.

As shown in FIG. 1, there has been described the case where the inductors L1, L2, respectively provided in the capacitors C1, C2, have the same size, but this is not restrictive. For example, when the parasitic inductance to cancel each of the capacitors C1, C2 is different, the size and wiring pattern of each of the inductors L1, L2 may be made different respectively. Although it has been described that the inductor L1 is provided in the second layer of the multilayered board and the inductor L2 the third layer, this is not restrictive, and for example, is provided in the inductor L2 may be provided in the second layer while the inductor L1 may be provided in the third layer. Although it has been described that the circuit board 2 is the multilayered board which is the glass epoxy board, this is not restrictive. For example, the circuit board 2 may be a single-layered board, and the electrode T1, the electrode T2, the coil-shaped wiring patterns of the inductor L1 and the inductor L6, and the coil-shaped wiring patterns of the inductor L2 and the inductor L3 may be provided on the same plane. Note that an insulating film is provided in each of the intersection portion 12 between the inductor L1 and the inductor L2 and the intersection portion between the inductor L6 and the inductor L3 so that the wiring patterns thereof are not electrically connected with each other. Further, the inductor L1 and the inductor L2 may not include the inductor L1a and the inductor L2a corresponding to the linear-portion wiring patterns shown in FIG. 3A.

MODIFIED EXAMPLE 1

Although there has been described the case in the first preferred embodiment where the angle α defined by the inductor L1b and the inductor L2b is about 22°, this is not restrictive.

Figure 8A:
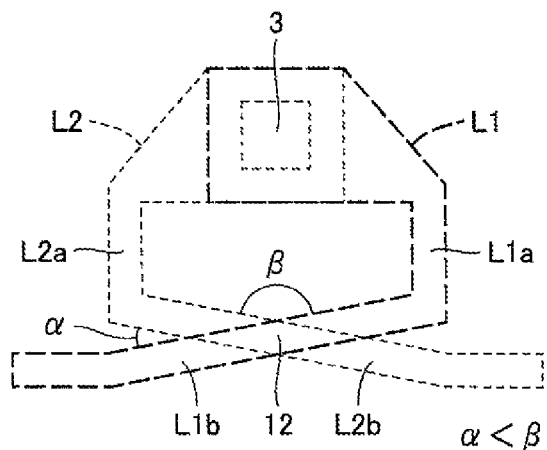
FIGS. 8A and 8B are plan views showing wiring patterns of inductors according to a modified example of the first preferred embodiment of the present invention.
Figure 8B:
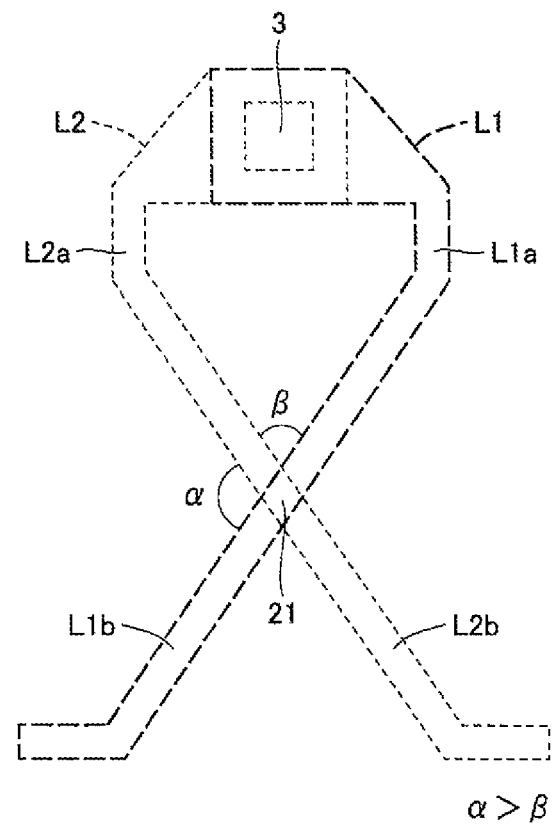

FIGS. 8A and 8B are plan views showing wiring patterns of inductors according to a modified example of the first preferred embodiment of the present invention.

FIG. 8A illustrates coil-shaped wiring patterns of the inductor L1 and the inductor L2 of the modified example. The angle α defined by the oblique-portion wiring pattern of the inductor L1 (the inductor L1b) and the oblique-portion wiring pattern of the inductor L2 (the inductor L2b) is smaller than the angle β (α<β). The angle α is assumed to be about 12°, for example, which is small as compared with about 22° shown in the first preferred embodiment. With decrease in the angle α, the coupling coefficient of the inductor L1 and the inductor L2 increases, and its influence on deviations in lamination of the circuit board also increases. It is thus necessary to increase the sizes of the inductors such that the intersection portion 12 between the inductor L1b and the inductor L2b does not overlap the linear-portion wiring patterns of the inductor L1 and the inductor L2, even when deviations in lamination occurs in the circuit board.

FIG. 8B illustrates coil-shaped wiring patterns of the inductor L1 and the inductor L2 in another modified example. The angle α defined by the oblique-portion wiring pattern of the inductor L1 (the inductor L1b) and the oblique-portion wiring pattern of the inductor L2 (the inductor L2b) is larger than the angle β (α>β). The angle α is assumed to be about 120°, for example. With increase in the angle α, the coupling coefficient of the inductor L1 and the inductor L2 decreases, and its influence on deviations in lamination of the circuit board also decreases. It is thus possible to decrease the sizes of the inductors since the intersection portion 12 between the inductor L1b and the inductor L2b does not overlap the linear-portion wiring patterns of the inductor L1 and the inductor L2, even when deviations in lamination occurs in the circuit board. However, the inductor L1 and the inductor L2 become larger vertically in the figure with increase in the angle α.

Modified Example 2

Figure 9A:
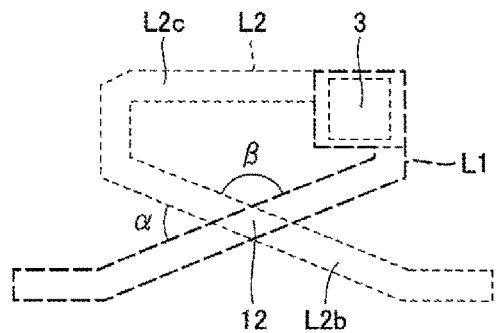
FIG. 9A is a plan view showing wiring patterns of inductors according to another modified example of the first preferred embodiment of the present invention.
Figure 9B:
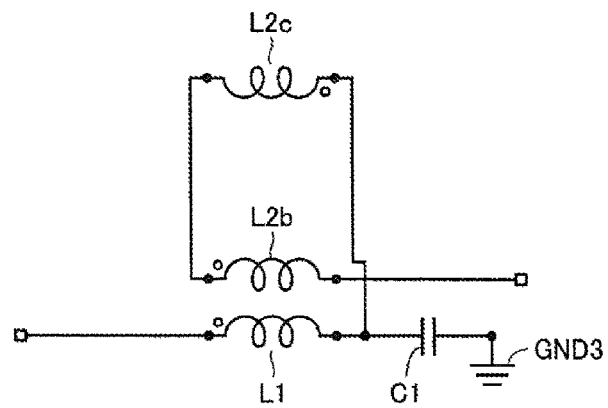
FIG. 9B is a circuit diagram showing an equivalent circuit according to the same.

There has been described the case in the first preferred embodiment where the coil-shaped wiring pattern of the inductor L1 and the coil-shaped wiring pattern of the inductor L2 have the same shape and are line-symmetric with respect to the electrode T1, but this is not restrictive. FIG. 9A is a plan view showing wiring patterns of inductors according to another modified example of the first preferred embodiment of the present invention, and FIG. 9B is a circuit diagram showing an equivalent circuit according to the same. The plan view shown in FIG. 9A illustrates the coil-shaped wiring patterns of the inductor L1 and the inductor L2. The wiring pattern of the inductor L1 and the wiring pattern of the inductor L2 are connected to the electrode T1 by using a common via 3. The wiring pattern of the inductor L1 includes the oblique-portion wiring pattern. The wiring pattern of the inductor L2 includes an L-shaped wiring pattern (corresponding to an inductor L2c) and the oblique-portion wiring pattern (corresponding to the inductor L2b).

Further, in the plan view, the oblique-portion wiring pattern of the inductor L1 and the oblique-portion wiring pattern of the inductor L2 (the inductor L2b) intersect with each other and include the intersection portion 12. Angles defined by the inductor L1b and the inductor L2b in the intersection portion 12 include an angle α defined clockwise from the inductor L1 to the inductor L2b, and an angle β defined clockwise from the inductor L2b to the inductor L1. Neither the angle α nor the angle β is a right angle, and the angle β is larger than the angle α. The angle α is assumed to be about 22°, for example.

The equivalent circuit shown in FIG. 9B is an equivalent circuit of the inductor L1 and the inductor L2 shown in FIG.

9A. The inductor L2 is divided into the inductor L2c corresponding to the L-shaped-portion wiring pattern and the inductor L2b corresponding to the oblique-portion wiring pattern. The inductor L1 and the inductor L2b include the intersection portion 12 and are thus disposed in positions adjacent to each other in the equivalent circuit. The smaller the angle α shown in FIG. 9A, the larger a coupling coefficient of the inductor L1 and the inductor L2b. Note that the coupling coefficient becomes largest when the inductor L1 and the inductor L2b are in the parallel state, rather than the inductor L1 and the inductor L2b intersect with each other.

Second Preferred Embodiment

Figure 10:
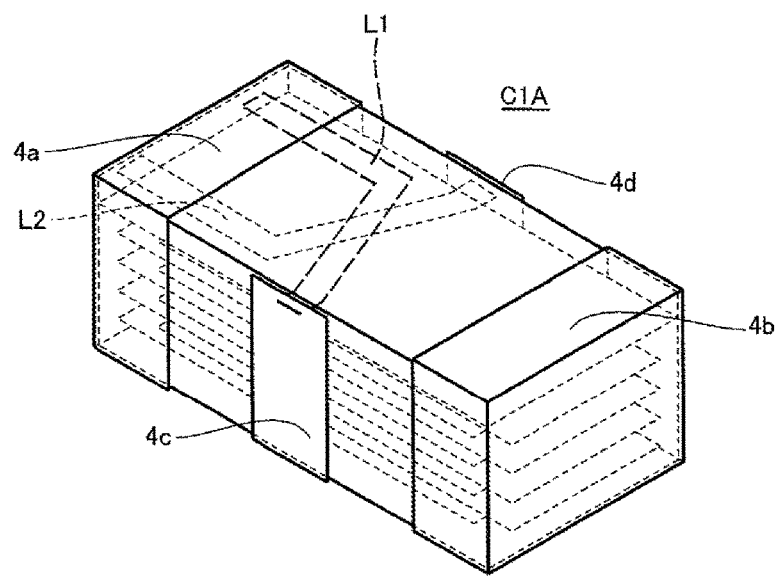
FIG. 10 is a perspective view of a capacitor according to a second preferred embodiment of the present invention.

In the first preferred embodiment of the present invention, the case has been described where the inductors L1 to L3 and L6 are provided in the circuit board 2 as shown in FIG. 1 However, the inductors may not be provided in the circuit board 2, but may be provided in an inside of a capacitance element. Thus, in the second preferred embodiment of the present invention, a description will be given of a configuration where a circuit including the inductors is provided inside the capacitance element. FIG. 10 is a perspective view of a capacitor according to the second preferred embodiment of the present invention.

A capacitor C1A shown in FIG. 10 is a multilayer ceramic capacitor, in which a plurality of internal electrodes to generate a capacitance and a plurality of dielectric ceramic layers are laminated alternately. The laminated internal electrodes are alternately extracted at one end portion and the other end portion of the capacitor C1A. The internal electrodes extracted at the respective end portions are connected with external electrodes 4a, 4b provided at the respective end portions of the capacitor C1A. Further, the inductors L1, L2 are provided inside the capacitor C1A as a circuit to cancel parasitic inductance. The inductor L1 is provided on a ceramic green sheet laminated on the top internal electrode, and the inductor L2 is provided on a ceramic green sheet laminated on the ceramic green sheet provided with the inductor L1. The inductor L1 includes a linear-portion wiring pattern that is connected with the external electrode 4a (the electrode connected with the electrode T1 in the circuit board 2 shown in FIG. 1) and extends along a long-side direction of the capacitor C1A, and an oblique-portion wiring pattern that cuts across the capacitor C1A and reaches a side-surface electrode 4c. The inductor L2 includes a linear-portion wiring pattern that is connected with the same external electrode 4a as the inductor L1 and extends along the long-side direction of the capacitor C1A, and an oblique-portion wiring pattern that cuts across the capacitor C1A from the opposite side from the wiring pattern of the inductor L1 and reaches a side-surface electrode 4d. The side-surface electrode 4d is provided on the opposite surface of the capacitor C1A from the side-surface electrode 4c connected with the inductor L1.

Also in the capacitor C1A, in the plan view, the oblique-portion wiring pattern of the inductor L1 and the oblique-portion wiring pattern of the inductor L2 intersect with each other in a position on the capacitor C1A, and any angle defined by the oblique-portion wiring pattern of the inductor L1 and the oblique-portion wiring pattern of the inductor L2 is an angle other than a right angle. That is, the oblique-portion wiring pattern of the inductor L1 and the oblique-portion wiring pattern of the inductor L2 do not orthogonally intersect with each other. For example, the angle defined clockwise from the oblique-portion wiring pattern of the inductor L1 to the oblique-portion wiring pattern of the inductor L2 is assumed to be about 22°, for example. The plan view here is a field of view from a normal direction of the plane of the capacitor C1A where the inductors L1, L2 are provided.

Figure 11:
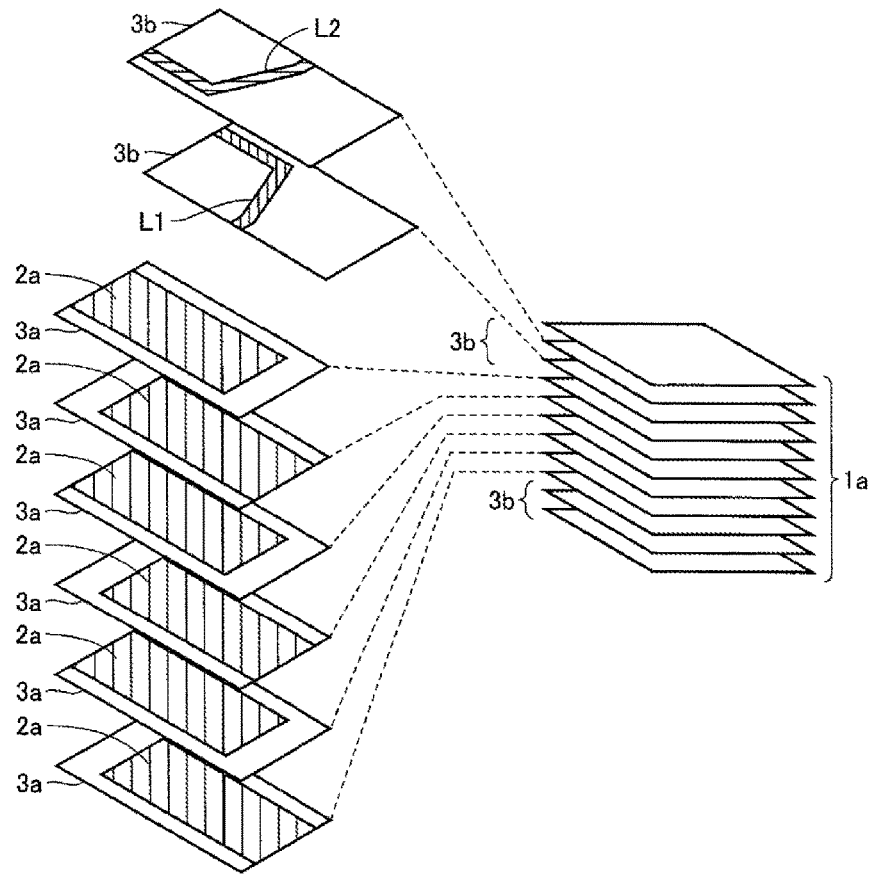
FIG. 11 is an exploded perspective view showing a configuration of a main portion of the capacitor according to the second preferred embodiment of the present invention.

The main configuration of the capacitor C1A will be described in further detail. FIG. 11 is an exploded perspective view showing the configuration of the main portion of the capacitor according to the second preferred embodiment of the present invention. As shown in FIG. 11, conductive paste (Ni paste) is printed by screen printing on a barium titanate-based ceramic green sheet (e.g., such a ceramic green sheet as to have a thickness of 3 μm after firing) 3a, to form an internal electrode pattern 2a. While a plurality of layers (e.g., 350 layers) of the ceramic green sheets 3a each printed with the internal electrode pattern 2a are laminated, on vertically both surface sides of the lamination, a plurality of layers (e.g., 25 layers) of ceramic green sheets (dummy layers) 3b each not having an internal electrode formed thereon are laminated. On some of the ceramic green sheets 3b, the coil-shaped wiring patterns of the inductors L1, L2 are printed by screen printing so as to be formed. By pressure-bonding the plurality of ceramic green sheets 3a and the plurality of ceramic green sheets 3b to each other, an unfired laminate is formed. The formed laminate is divided into a large number of capacitors C1A by such a method as cutting with a dicing machine. The divided laminate is fired, and copper electrodes are baked onto both end portions of the fired laminate so as to be conducted with a predetermined internal electrode pattern 2a to form the external electrodes 4a, 4b, and copper electrodes are baked onto side surface parts so as to be conducted with the inductors L1, L2 to form the side-surface electrodes 4c, 4d.

As thus described, in the capacitor C1A according to the second preferred embodiment of the present invention, the inductors L1, L2 are provided inside in order to cancel the parasitic inductance of the capacitor C1A, as shown in FIG. 10. In the capacitor C1A, since any angle defined by the oblique-portion wiring pattern of the inductor L1 and the oblique-portion wiring pattern of the inductor L2 is an angle other than a right angle in the plan view, even when deviations in lamination of the ceramic green sheets 3a, 3b occurs due to manufacturing variation, it has a small influence on the negative inductance component to cancel the parasitic inductance of the capacitor C1A. Accordingly, the capacitor C1A which experiences little or no influence due to manufacturing variations is used to create a filter circuit, thus enabling improvement of the noise reduction effect in the high frequency band.

In the capacitor C1A, in order to make the capacitance between the coils small, the capacitor layer is preferably a high dielectric constant material such as barium titanate, and the coil layer is preferably a low dielectric constant material such as calcium zirconate. Further, although the inductor L1 shown in FIG. 11 is provided in the layer below the inductor L2, it may be provided in in a layer above the inductor L2, as the inductor L1 shown in FIG. 1.

Modified Example

Figure 12:
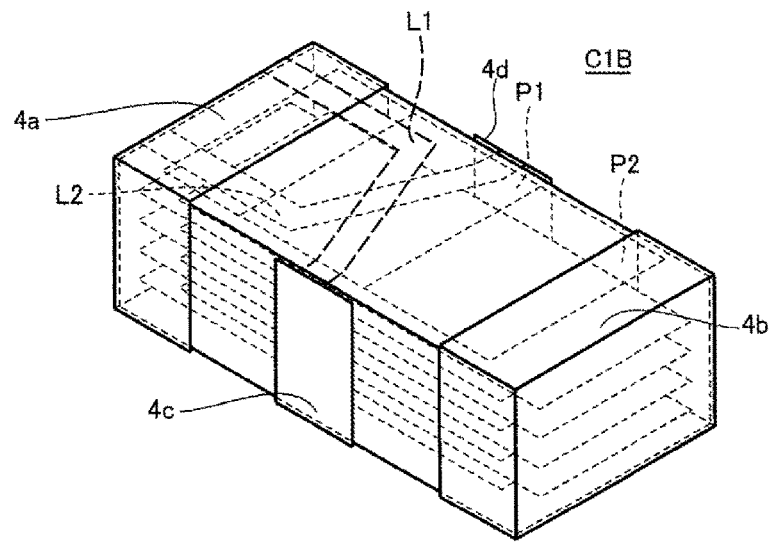
FIG. 12 is a perspective view of a capacitor according to a modified example of the second preferred embodiment of the present invention.

In the second preferred embodiment of the present invention, the case has been described where the inductors L1, L2 are provided inside the capacitance element as shown in FIG. 10 However, the inductors L1, L2 may not be provided inside the capacitance element, but the inductors L1, L2 may be provided on the surface of the capacitance element. Thus, in the present modified example, a description will be given of a configuration where the inductors L1, L2 are provided on the surface of the capacitance element as the circuit. FIG. 12 is a perspective view of a capacitor according to the modified example of the second preferred embodiment of the present invention. FIGS. 13A to 13D are exploded plan views showing the configuration of the circuit of the inductors according to the modified example of the second preferred embodiment of the present invention.

A capacitor C1B shown in FIG. 12 is a multilayer ceramic capacitor, in which a plurality of internal electrodes to generate a capacitance and a plurality of dielectric ceramic layers are laminated alternately. Further, the inductors L1, L2 are provided on the surface of the capacitor C1B as a circuit to cancel the parasitic inductance. Note that an insulating layer P1 is provided in the intersection portion between the inductor L1 and the inductor L2, and further, an insulating layer P2 covers the inductor L1 and the inductor L2. The inductor L1 includes a linear-portion wiring pattern that is connected with the external electrode 4a (the electrode connected with the electrode T1 in the circuit board 2 shown in FIG. 1) and extends along a long-side direction of the capacitor C1B, and an oblique-portion wiring pattern that cuts across the capacitor C1B and reaches the side-surface electrode 4c. The inductor L2 includes a linear-portion wiring pattern that is connected with the same external electrode 4a as the inductor L1 and extends along the long-side direction of the capacitor C1B, and an oblique-portion wiring pattern that cuts across the capacitor C1B from the opposite side from the wiring pattern of the inductor L1 and reaches the side-surface electrode 4d.

The side-surface electrode 4d is provided on the opposite surface of the capacitor C1B from the side-surface electrode 4c connected with the inductor L1.

Also in the capacitor C1B, in the plan view, the oblique-portion wiring pattern of the inductor L1 and the oblique-portion wiring pattern of the inductor L2 intersect with each other, and any angle defined by the oblique-portion wiring pattern of the inductor L1 and the oblique-portion wiring pattern of the inductor L2 is an angle other than a right angle. That is, the oblique-portion wiring pattern of the inductor L1 and the oblique-portion wiring pattern of the inductor L2 do not orthogonally intersect with each other. For example, the angle defined clockwise from the oblique-portion wiring pattern of the inductor L1 to the oblique-portion wiring pattern of the inductor L2 is assumed to be 22°. The plan view here is a field of view from a normal direction of the plane of the capacitor C1B where the inductors L1, L2 are provided.

Figure 13A:
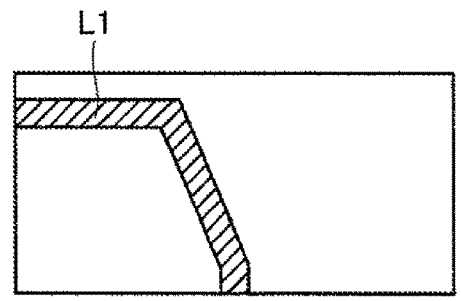
FIGS. 13A to 13D are exploded plan views showing a configuration of a circuit of inductors according to the modified example of the second preferred embodiment of the present invention.
Figure 13B:
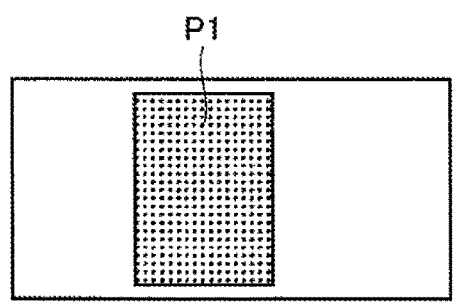
Figure 13C:
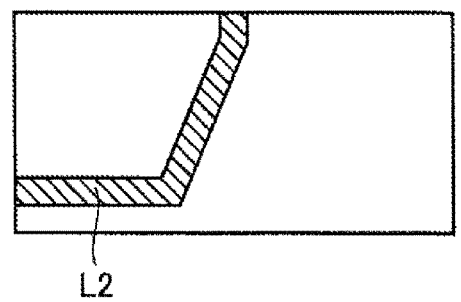
Figure 13D:
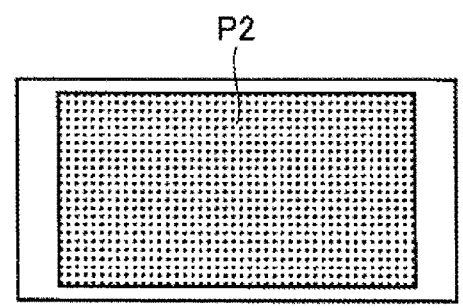

The configuration of the circuit of the capacitor C1B will be described in further detail. FIGS. 13A to 13D are exploded plan views showing the configuration of the circuit of the inductors according to the modified example of the second preferred embodiment of the present invention. As shown in FIG. 13A, on the surface of the capacitor C1B, the coil-shaped wiring pattern of the inductor L1 is printed by screen printing so as to be formed. Next, the insulating layer P1 with a low dielectric constant, such as a polyimide layer, is provided in the intersection portion between the inductor L1 and the inductor L2 (FIG. 13B), and the coil-shaped wiring pattern of the inductor L2 is printed by screen printing so as to be formed (FIG. 13C). Finally, the insulating layer P2, such as a polyimide layer, which covers the inductor L1 and the inductor L2 is provided to protect the coils (FIG. 13D).

As thus described, in the capacitor C1B according to the present modified example, the inductors L1, L2 are provided on the surface in order to cancel the parasitic inductance of the capacitor C1B, as shown in FIG. 12. In the capacitor C1B, since any angle defined by the oblique-portion wiring pattern of the inductor L1 and the oblique-portion wiring pattern of the inductor L2 is an angle other than a right angle in the plan view, even when printing deviations occurs between the coil-shaped wiring patterns of the inductors L1, L2 due to manufacturing variation, it has a small influence on the negative inductance component to cancel the parasitic inductance of the capacitor C1B. Accordingly, the capacitor C1B which experiences little or no influence due to manufacturing variations is used to create a filter circuit, thus enabling improvement of the noise reduction effect in the high frequency band. Although the inductor L1 shown in FIG. 13 is provided in the layer below the inductor L2, it may be provided in in a layer above the inductor L2, as the inductor L1 shown in FIG. 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board mounted with a capacitance element, the circuit board comprising:
    an electrode to connect one terminal of the capacitance element;
    a first inductance element including a first wire that extends from a first end connected with the electrode to a second end across a region mounted with the capacitance element; and
    a second inductance element including a second wire that extends from a first end connected with the electrode to a second end across the region mounted with the capacitance element from an opposite side from the first wire; wherein
    in a plan view, the first wire of the first inductance element and the second wire of the second inductance element intersect with each other, and any angle defined by the first wire and the second wire is an angle other than a right angle.

2. The circuit board according to claim 1, wherein the first inductance element and the second inductance element have a same shape and have a line-symmetric shape with respect to the electrode.

3. The circuit board according to claim 1, wherein the angle defined by the first wire and the second wire is an angle smaller than 90 degrees counterclockwise from the first wire to the second wire in a plan view.

4. The circuit board according to claim 1, wherein
    the circuit board is a multilayer board; and
    a layer provided with the second inductance element is different from a layer provided with the first inductance element.

5. The circuit board according to claim 4, wherein a layer provided with the electrode is different from the layer provided with the second inductance element, and is also different from the layer provided with the first inductance element.

6. A filter circuit comprising:
    the circuit board according to claim 1; and
    a capacitor mounted in the circuit board defining the capacitance element.

7. The filter circuit according to claim 6, wherein the first inductance element and the second inductance element have a same shape and have a line-symmetric shape with respect to the electrode.

8. The filter circuit according to claim 6, wherein the angle defined by the first wire and the second wire is an angle smaller than 90 degrees counterclockwise from the first wire to the second wire in a plan view.

9. The filter circuit according to claim 6, wherein
the circuit board is a multilayer board; and
a layer provided with the second inductance element is different from a layer provided with the first inductance element.

10. The filter circuit according to claim 9, wherein a layer provided with the electrode is different from the layer provided with the second inductance element, and is also different from the layer provided with the first inductance element.

11. A capacitance element comprising:
a circuit on a surface or inside of a circuit board and including:
a first inductance element including a first wire that extends from a first end connected with one terminal of the capacitance element to a second end across the capacitance element; and
a second inductance element including a second wire that extends from a first end connected with one terminal of the capacitance element to a second end across the capacitance element from an opposite side from the first wire; wherein
in a plan view, the first wire of the first inductance element and the second wire of the second inductance element intersect with each other, and any angle defined by the first wire and the second wire is an angle other than a right angle.

12. The capacitance element according to claim 11, wherein the first inductance element and the second inductance element have a same shape and have a line-symmetric shape with respect to the terminal.

13. The capacitance element according to claim 11, wherein the angle defined by the first wire and the second wire is an angle smaller than 90 degrees counterclockwise from the first wire to the second wire in a plan view.

14. The capacitance element according to claim 11, wherein
the circuit is provided in or on the circuit board that is a multilayer board; and
a layer provided with the second inductance element is different from a layer provided with the first inductance element.

15. The capacitance element according to claim 14, wherein a layer provided with the electrode is different from the layer provided with the second inductance element, and is also different from the layer provided with the first inductance element.

16. A capacitance element comprising:
a ceramic body including a plurality of laminated ceramic layers and including a pair of main surfaces that face each other and side surfaces connecting the main surfaces;
a plurality of internal electrodes disposed inside the ceramic body; and
a plurality of external electrodes disposed on the side surfaces of the ceramic body and electrically connected respectively with the plurality of internal electrodes; wherein
in the ceramic body, a first functional portion and a second functional portion are disposed along a height direction connecting the pair of mutually facing main surfaces;
the first functional portion includes:
a first internal electrode including a linear shape and extending from a first side surface of the ceramic body to a second side surface of the ceramic body which does not face the first side surface; and
a second internal electrode including a linear shape and extending from the first side surface to a third side surface of the ceramic body which faces the second side surface; wherein
the first internal electrode and the second internal electrode are disposed via the ceramic layers and respectively define inductance elements;
any angle defined by the first internal electrode and the second internal electrode, which intersect with each other, is an angle other than a right angle in a plan view;
the second functional portion includes:
a third internal electrode including a surface shape and extending from the first side surface; and
a fourth internal electrode including a surface shape and extending from a fourth side surface of the ceramic body which faces the first side surface; wherein
a plurality of combinations of the third internal electrode and the fourth internal electrode which face the height direction are disposed via the ceramic layers.

* * * * *